(12) United States Patent
Zhang et al.

(10) Patent No.: US 11,418,263 B2
(45) Date of Patent: Aug. 16, 2022

(54) SYSTEMS AND METHODS FOR OPTICAL FULL-FIELD TRANSMISSION USING PHOTONIC INTEGRATION

(71) Applicant: CABLE TELEVISION LABORATORIES, INC, Louisville, CO (US)

(72) Inventors: Haipeng Zhang, Broomfield, CO (US); Junwen Zhang, Broomfield, CO (US); Mu Xu, Broomfield, CO (US); Zhensheng Jia, Superior, CO (US); Luis Alberto Campos, Superior, CO (US)

(73) Assignee: Cable Television Laboratories, Inc., Louisville, CO (US)

( * ) Notice: Subject to any disclaimer, the term of this patent is extended or adjusted under 35 U.S.C. 154(b) by 82 days.

(21) Appl. No.: 16/855,921

(22) Filed: Apr. 22, 2020

(65) Prior Publication Data
US 2020/0336211 A1     Oct. 22, 2020

Related U.S. Application Data

(60) Provisional application No. 62/837,087, filed on Apr. 22, 2019.

(51) Int. Cl.
*H04B 10/50* (2013.01)
*G02F 1/21* (2006.01)
(Continued)

(52) U.S. Cl.
CPC ......... *H04B 10/504* (2013.01); *G02B 27/283* (2013.01); *G02B 27/286* (2013.01);
(Continued)

(58) Field of Classification Search
CPC .. H04B 10/504; H04B 10/25; H04B 10/5161; G02B 27/286; G02F 1/218; H01S 5/3224; H01S 5/32391
(Continued)

(56) References Cited

U.S. PATENT DOCUMENTS 10,944,478 B2 *  3/2021  Zhang ................. H04B 10/532
2002/0186445 A1 * 12/2002  Leight ............. H04B 10/25752
                                                            359/279

(Continued)

OTHER PUBLICATIONS

Zhu et al; Narrow-linewidth, tunable external cavity dual-band diode lasers through InP/GaAs—Si3N4 hybrid integration; Feb. 2019; Optics Express; pp. 1-9. (Year: 2019).*
(Continued)

*Primary Examiner* — Amritbir K Sandhu
(74) *Attorney, Agent, or Firm* — Armstrong Teasdale LLP

(57) ABSTRACT

An optical full-field transmitter for an optical communications network includes a primary laser source configured to provide a narrow spectral linewidth for a primary laser signal, and a first intensity modulator in communication with a first amplitude data source. The first intensity modulator is configured to output a first amplitude-modulated optical signal from the laser signal. The transmitter further includes a first phase modulator in communication with a first phase data source and the first amplitude-modulated optical signal. The first phase modulator is configured to output a first two-stage full-field optical signal. The primary laser source has a structure based on a III-V compound semiconductor.

20 Claims, 6 Drawing Sheets

(51) Int. Cl.
*G02B 27/28* (2006.01)
*H01S 5/32* (2006.01)
*H04B 10/516* (2013.01)
*H04B 10/25* (2013.01)
*H01S 5/323* (2006.01)

(52) U.S. Cl.
CPC ............ *G02F 1/218* (2013.01); *H01S 5/3224* (2013.01); *H01S 5/32391* (2013.01); *H04B 10/25* (2013.01); *H04B 10/5161* (2013.01); *G02F 1/212* (2021.01)

(58) Field of Classification Search
USPC ........................................................ 359/245
See application file for complete search history.

(56) References Cited

U.S. PATENT DOCUMENTS

| | | | | |
|---|---|---|---|---|
| 2009/0274469 | A1* | 11/2009 | Yuki | H04J 14/06 398/152 |
| 2010/0178057 | A1* | 7/2010 | Shieh | H04L 27/2697 398/79 |
| 2015/0249504 | A1* | 9/2015 | Slavik | H04B 10/504 398/183 |
| 2019/0009358 | A1* | 1/2019 | Vorontsov | H01S 3/005 |
| 2020/0336211 | A1* | 10/2020 | Zhang | G02B 27/286 |
| 2021/0234616 | A1* | 7/2021 | Morsy-Osman | H04B 10/532 |

OTHER PUBLICATIONS

Guan et al; Widely-tunable, narrow-linewidth III-V/silicon hybrid external-cavity laser for coherent communication; Apr. 2018; Optics Express; pp. 1-14. (Year: 2018).*

Duan et al.; Narrow spectral linewidth in InAs/InP quantum dot distributed feedback lasers; Mar. 2018; Applied physics; pp. 1-6. (Year: 2018).*

Zhu et al; Narrow-linewidth, tunable external cavity dual-band diode lasers through InP/GaAsSi3N4 hybrid integration; Feb. 2019; Optical society of America; pp. 1-9. (Year: 2019).*

Billah et al; Hybrid integration of silicon photonics circuits and InP lasers by photonic wire bonding; Jul. 2018; optical society of America; pp. 1-8. (Year: 2018).*

* cited by examiner

SYSTEMS AND METHODS FOR OPTICAL FULL-FIELD TRANSMISSION USING PHOTONIC INTEGRATION

CROSS REFERENCE TO RELATED APPLICATIONS

This application claims the benefit of and priority to U.S. Provisional Patent Application Ser. No. 62/837,087, filed Apr. 22, 2019, which is incorporated herein by reference in its entirety.

BACKGROUND

The field of the disclosure relates generally to fiber communication networks, and more particularly, to optical networks implementing optical signal modulation.

Many of today's telecommunications networks include an access network through which end user subscribers connect to a service provider. Bandwidth requirements for delivering high-speed data-intensive applications and services through the access network are rapidly increasing to meet growing consumer demands, and particularly in the continuously-developing fields of high-definition video-on-demand, cloud services, Internet of Things (IoT), and "Big Data." At present, data delivery over the access network is growing by gigabits (Gb)/second for residential subscribers, and multi-Gb/s for business subscribers, and is expected to reach multi-Gb/s for typical users.

To accommodate such high demand in a scalable manner, a variety of optical network architectures have been proposed and implemented in the field. In one example, Time Domain Multiple Access (TDMA) techniques provide a dynamic time slot assignment to respective users, and thereby enable multiple users to share the same passive network infrastructure. TDMA, however, is limited in its ability to provide a guaranteed data rate per user. To overcome this limitation, wavelength division multiplexing (WDM) techniques have been implemented to improve capacity per user and provide an additional degree of flexibility through dynamic wavelength assignment. Conventional WDM technology, however, is limited by low receiver sensitivity, and by few options available to upgrade and scale the technology.

Present access networks are often based on passive optical network (PON) access technologies, which have become a dominant system architecture to meet growing high capacity demand from end users. However, a current consolidation trend in the field has led many network operators to reduce the number of optical line terminals (OLTs) in the PON. Furthermore, optical access networks using conventional signal transmission technology, such as intensity modulation with direct detection (IM-DD), are reaching a saturation point. As data rate increases beyond 10 Gb/s (10G), IM-DD signal transmission suffers from inefficient spectrum utilization, and is susceptible to fiber impairments such as chromatic dispersion (CD) and polarization mode dispersion (PMD).

As PON systems evolve towards 100 Gb/s and higher data rates, coherent technology is increasingly being seen as a solution for optical access networks, due to its superior performance and vast potential over conventional signal transmission technologies. In particular, in comparison with IM-DD systems, which suffer from limited modulation bandwidth, short transmission distance, and poor received sensitivity, coherent technology systems achieve significantly higher receiver sensitivity, inherent frequency selectivity, and linear field detection capability that enables full compensation of linear channel impairments. Coherent technology supports exceptionally high data throughput over long reach (e.g., >50 km), and both increases the overall capacity and extends the power budget for WDM-PON systems.

Long distance transmission using coherent technology, however, requires elaborate post-processing, including signal equalizations and carrier recovery, to adjust for impairments experienced along the transmission pathway, thereby presenting significant challenges by significantly increasing system complexity. Thus, despite the benefits afforded by coherent technology, these benefits are obtained at a greater financial cost due to the high complexity of coherent transceivers and receivers. The cost challenges of coherent technology is significantly magnified with respect to implementation in PON-based optical access networks.

For example, in the downlink of conventional PONs, the complexity limits on the transceiver in the OLT, such as at the headend, central office, and/or hub, are less stringent than the limits placed on a receiver in an optical network unit (ONU), since the cost of the OLT transceiver, which sends and receives data to and from multiple ONUs, is shared by all end users supported in the respective network. In contrast, the cost of each ONU is driven, and likely borne solely, by the respective end user. Accordingly, lowering the cost and complexity of the coherent component technology will more significantly impact the ONU than the OLT. For this reason, the complexity and high cost of conventional coherent transceivers has been limited to point-to-point (P2P) applications, which may employ one ONU per OLT, and not implemented in point-to-multipoint (P2MP) applications, which typically employ a number of ONUs for each OLT.

The overall cost of conventional coherent systems is dominated by the complex optical and opto-electronic components of the coherent transceivers, such as high-performance tunable lasers and local-oscillators (LOs), high-speed modulators, digital signal processing (DSP) chips, polarization optics, etc. Accordingly, there is a need in the industry for further innovations to reduce the cost of coherent optical components in the coherent access network. Several such innovations have been recently introduced by the present inventors. Novel systems and methods implementing coherent optical injection locking (COIL)-based architectures, for example, are described in greater detail in U.S. Pat. Nos. 9,912,409 and 10,200,123 to the same inventors, both of which are incorporated by reference herein in their entireties.

Accordingly, it is desirable to further improve upon these novel systems and methods to develop even further savings in the cost, power, and footprint of efficient coherent transceivers to meet the unique requirements of access networks, while also enabling implementation of hybrid PONs that may employ a mix of WDM and TDMA techniques.

BRIEF SUMMARY

In an embodiment, an optical full-field transmitter is provided for an optical communications network. The transmitter includes a primary laser source configured to provide a narrow spectral linewidth for a primary laser signal, and a first intensity modulator in communication with a first amplitude data source. The first intensity modulator is configured to output a first amplitude-modulated optical signal from the laser signal. The transmitter further includes a first phase modulator in communication with a first phase data source and the first amplitude-modulated optical signal.

The first phase modulator is configured to output a first two-stage full-field optical signal. The primary laser source has a structure based on a III-V compound semiconductor.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

Figure 1:
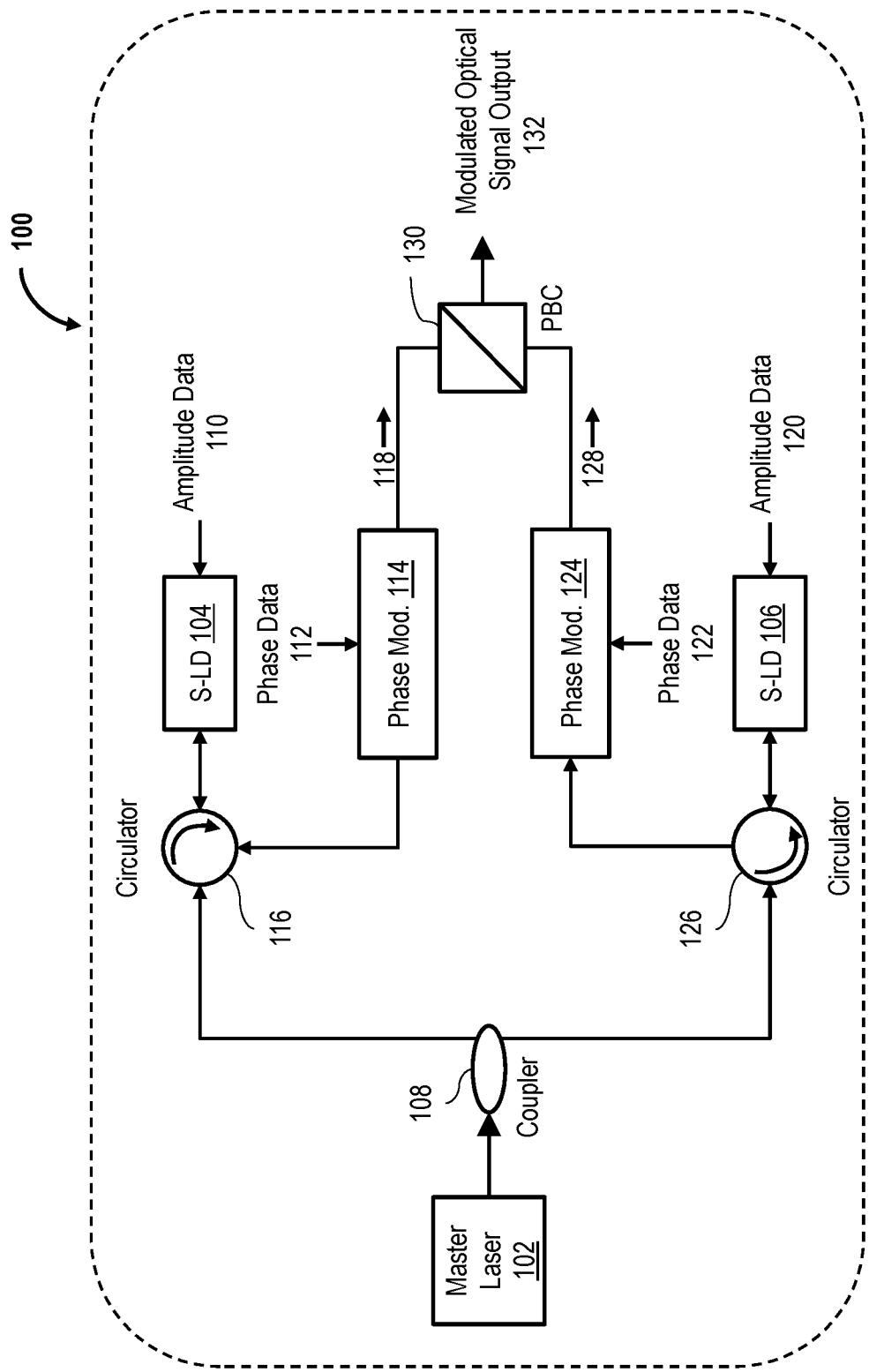
FIG. 1 is a schematic illustration of a dual-polarization coherent optical injection locking transmitter implementing full-field modulation based on amplitude and phase.

Unless otherwise indicated, the drawings provided herein are meant to illustrate features of embodiments of this disclosure. These features are believed to be applicable in a wide variety of systems including one or more embodiments of this disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a," "an," and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, the terms "processor" and "computer" and related terms, e.g., "processing device", "computing device", and "controller" are not limited to just those integrated circuits referred to in the art as a computer, but broadly refers to a microcontroller, a microcomputer, a programmable logic controller (PLC), an application specific integrated circuit (ASIC), and other programmable circuits, and these terms are used interchangeably herein. In the embodiments described herein, memory may include, but is not limited to, a computer-readable medium, such as a random access memory (RAM), and a computer-readable nonvolatile medium, such as flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include computer program storage in memory for execution by personal computers, workstations, clients, and servers.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

Furthermore, as used herein, the term "real-time" refers to at least one of the time of occurrence of the associated events, the time of measurement and collection of predetermined data, the time for a computing device (e.g., a processor) to process the data, and the time of a system response to the events and the environment. In the embodiments described herein, these activities and events occur substantially instantaneously.

As used herein, "modem termination system" (MTS) refers to a termination unit including one or more of an Optical Network Terminal (ONT), an optical line termination (OLT), a network termination unit, a satellite termination unit, a cable modem termination system (CMTS), and/or other termination systems which may be individually or collectively referred to as an MTS.

As used herein, "modem" refers to a modem device, including one or more a cable modem (CM), a satellite modem, an optical network unit (ONU), a DSL unit, etc., which may be individually or collectively referred to as modems.

As described herein, a "PON" generally refers to a passive optical network or system having components labeled according to known naming conventions of similar elements that are used in conventional PON systems. For example, an OLT may be implemented at an aggregation point, such as a headend/hub, and multiple ONUs may be disposed and operable at a plurality of end user, customer premises, or subscriber locations. Accordingly, an "uplink transmission" refers to an upstream transmission from an end user to a headend/hub, and a "downlink transmission" refers to a downstream transmission from a headend/hub to the end user, which may be presumed to be generally broadcasting continuously (unless in a power saving mode, or the like).

In the following embodiments, innovative systems and methods are described for implementing photonics integration into the coherent technology-based optical access network, as described above. The present embodiments also further improve upon the innovative optical full-field transmitter (OFFT) architectures and techniques described in greater detail in co-pending U.S. application Ser. No. 16/711,293, filed Dec. 11, 2019, by the same inventors. The subject matter of this co-pending application is also incorporated by reference herein in its entirety. The embodiments described herein introduce photonic integration into these co-pending technological innovations, and thereby realize still further cost and space savings that satisfy the increasing demand for inexpensive and efficient coherent transceivers in the access network paradigm.

FIG. 1 is a schematic illustration of a dual-polarization coherent optical injection locking (COIL) transmitter 100 implementing full-field modulation based on amplitude and phase. In an embodiment, transmitter 100 includes a master laser 102, a first slave laser 104, and a second slave laser 106. Master laser 102 may, for example, be an external cavity laser (ECL), and first and second lasers 104, 106 may be Fabry-Perot (FP) lasers in the COIL implementation thereof. In this example, first and second slave lasers 104, 106 are dedicated to modulating separate first and second polarizations (e.g., X- and Y-polarizations), respectively, of a dual-polarization signal.

More particularly, in operation of transmitter 100, the laser signal from master laser 102 is distributed to first slave laser 104 and second slave laser 106 by an optical coupler 108 in optical communication with master laser 102, first slave laser 104, and second slave laser 106. First slave laser 104 modulates, for the first single-polarization (e.g., X-polarization), a first amplitude data signal 110. A first phase data signal 112 is modulated by a first phase modulator 114 (e.g., external to first slave laser 104), which is in optical communication with a first optical circulator 116 disposed between first slave laser 104 and first phase modulator 114, and also between first slave laser 104 and optical coupler 108 (e.g., a three-port optical coupler, in this example).

That is, to transmit signals with both intensity and phase information, first slave laser is directly modulated for amplitude modulation of first amplitude data signal 110, which is combined with first phase data signal 112 modulated by first external phase modulator 114 for phase modulation and rotation. In this example, master laser 102 is presumed to be a high-quality ECL utilized to injection-lock first slave laser 104. First optical circulator 116 therefore functions to not only route both the master laser beam to first slave laser 104, but also to function to route the amplitude-modulated signal from first slave laser 104 to first phase modulator 114 that modulates the phase information of first phase data signal 112. By synthesizing the amplitude-modulation information and phase-modulation information of the first polarization into a first synthesized optical signal 118, full-field optical transmission may be achieved for the first single-polarization signal.

In a similar manner, second slave laser 106 modulates, for the second single-polarization (e.g., Y-polarization), a second amplitude data signal 120, and a second phase data signal 122 is modulated by a second phase modulator 124 in optical communication with a second optical circulator 126. Second optical circulator 126 is similarly disposed between second slave laser 106 and second phase modulator 124, and also between second slave laser 106 and optical coupler 108. A second synthesized optical signal 128 is achieved by synthesizing the amplitude-modulation information and phase-modulation information of the second polarization, thereby realizing full-field optical transmission for the second single-polarization signal as well. Dual-polarization OFFT operation is achieved for transmitter 100 by combining first and second synthesized optical signals 118, 128 with a polarization-beam-combiner (PBC) 130, which outputs a dual-polarization modulated optical output signal 132.

Systems and methods according to transmitter 100 are thus capable of reducing the cost for both the laser and the modulator. Additionally, the improved architecture that combines a phase modulator (e.g., phase modulators 114, 124) with a directly-modulated COIL laser (e.g., slave lasers 104, 106, respectively) significantly reduces both the optical insertion loss and the modulation loss seen by conventional utilization of parallel Mach-Zehnder Modulators (MZMs) in a conventional coherent I/Q modulator. The improved architecture of transmitter 100 effectively eliminates the need for the MZM for coherent modulation.

Figure 2B:
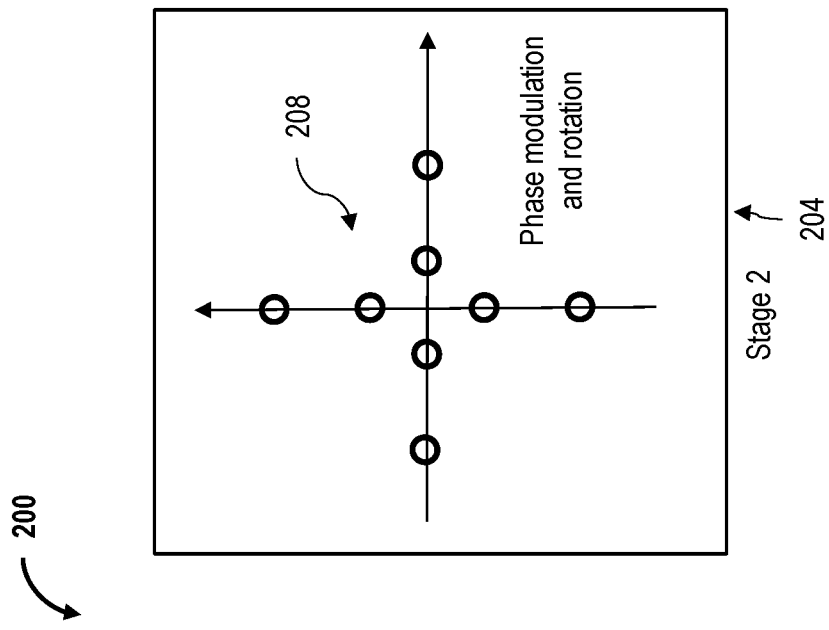
FIGS. 2A-B are graphical illustrations depicting an operational principle of the coherent optical injection locking transmitter depicted in FIG. 1.
Figure 2A:
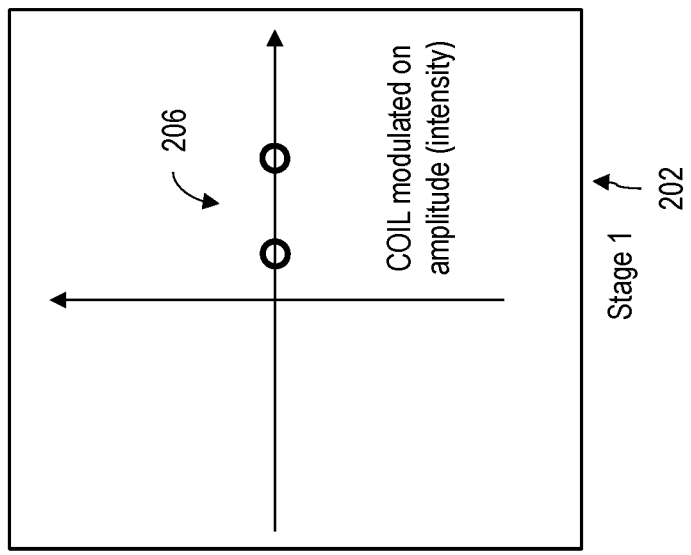

FIGS. 2A-B are graphical illustrations depicting an operational principle 200 of COIL transmitter 100, FIG. 1. More particularly, operational principle 200 achieves two-stage, full-field transmitter injection locking according to an amplitude modulation stage 202 and a phase modulation stage 204. In the embodiment depicted in FIGS. 2A and 2B, amplitude modulation stage 202 and phase modulation stage 204 are illustrated in the polar coordinate plane for illustrative purposes. At amplitude modulation stage 202, for example, transmitter 100 implements injection locking and amplitude modulation to obtain an amplitude-modulated COIL signal 206 (e.g., seen at circulator 116 or 126, FIG. 1). At phase modulation stage 204, transmitter 100 applies phase modulation to achieve full-field optical modulation of a full-field signal 208 (e.g., first or second synthesized optical signals 118, 128, FIG. 1). Since, according to operational principle 200, the amplitude and phase modulation remain naturally orthogonal to each other, implementation of both amplitude modulation stage 202 and phase modulation stage 204 together may optionally render the additional implementation of a bias control (e.g., in a separate, or third stage) unnecessary.

In comparison with conventional MZM-based modulators, which are known to experience significantly large insertion and modulation losses, transmitter 100 and operational principle 200 demonstrate significant advantages over such conventional techniques by achieving a significantly higher output power from the gain components present in the lasers. Indeed, in comparison with such conventional techniques, operational principle 200 demonstrates that the full-field transmitter may be implemented using only one COIL set of master/slave lasers (i.e., as opposed to a dual-polarization architecture, as illustrated in FIG. 1), with no bias or phase shift control needed. The structural configuration of transmitter 100 though, would not exclude the use of an external phase modulator, if so desired.

The improved design and operation of transmitter 100 though, may nevertheless result in an additional power consumption, due at least in part from the integrated optical circulator, which requires the additional polarization rotation components described above with respect to FIG. 2B. The following embodiments though, describe and illustrate several photonics integration solutions that address these particular challenges. These further solutions present alternative architectures and techniques that leverage state-of-art photonics integration technology based on silicon photonics (SiPho) and/or Indium Phosphide (InP) photonics. According to these several embodiments, the structural and operational design of the OFFT is significantly improved, and therefore of particular advantageous use in a PON, a coherent PON (CPON), a P2P coherent optical access network, or a P2MP coherent network.

SiPho-Based OFFT

Due to the large-scale production capability of the CMOS silicon industry, SiPho-based technologies are seen to be promising for providing highly integrated and low-cost components and systems for the future and near-future optical communication networks. Monolithic integration of SiPho technologies has already demonstrated generally good performance when implemented with respect to components such as modulators, photodetectors, polarization beam splitters/combiners, and other passive devices. However, this field is still lacking for a practical silicon-based light source solution.

The need for such practical light source solutions has driven recent research in the field toward the investigation of heterogeneous integration of III-V compound semiconductors, such as InP, on silicon. Typically, unstructured InP dies are bonded, epitaxial layers down, on a silicon-on-insulator (SoI) waveguide circuit wafer, after which the InP growth substrate is removed and the III-V epitaxial layer is patterned. With this approach, integrated high-performance ECLs having a wide tuning range and narrow spectral linewidth have been achieved. Today, commercially-available ECLs typically include multiple discrete components, such as two etalon filters, an InP gain chip, an end mirror, an optical isolator, and a few micro-lenses, etc. In contrast, an integrated solution for a hybrid laser is described below with respect to FIG. 3, which implements InP on a silicon platform, and thus achieves a significant reduction to both the fabrication and packaging costs.

Figure 3:
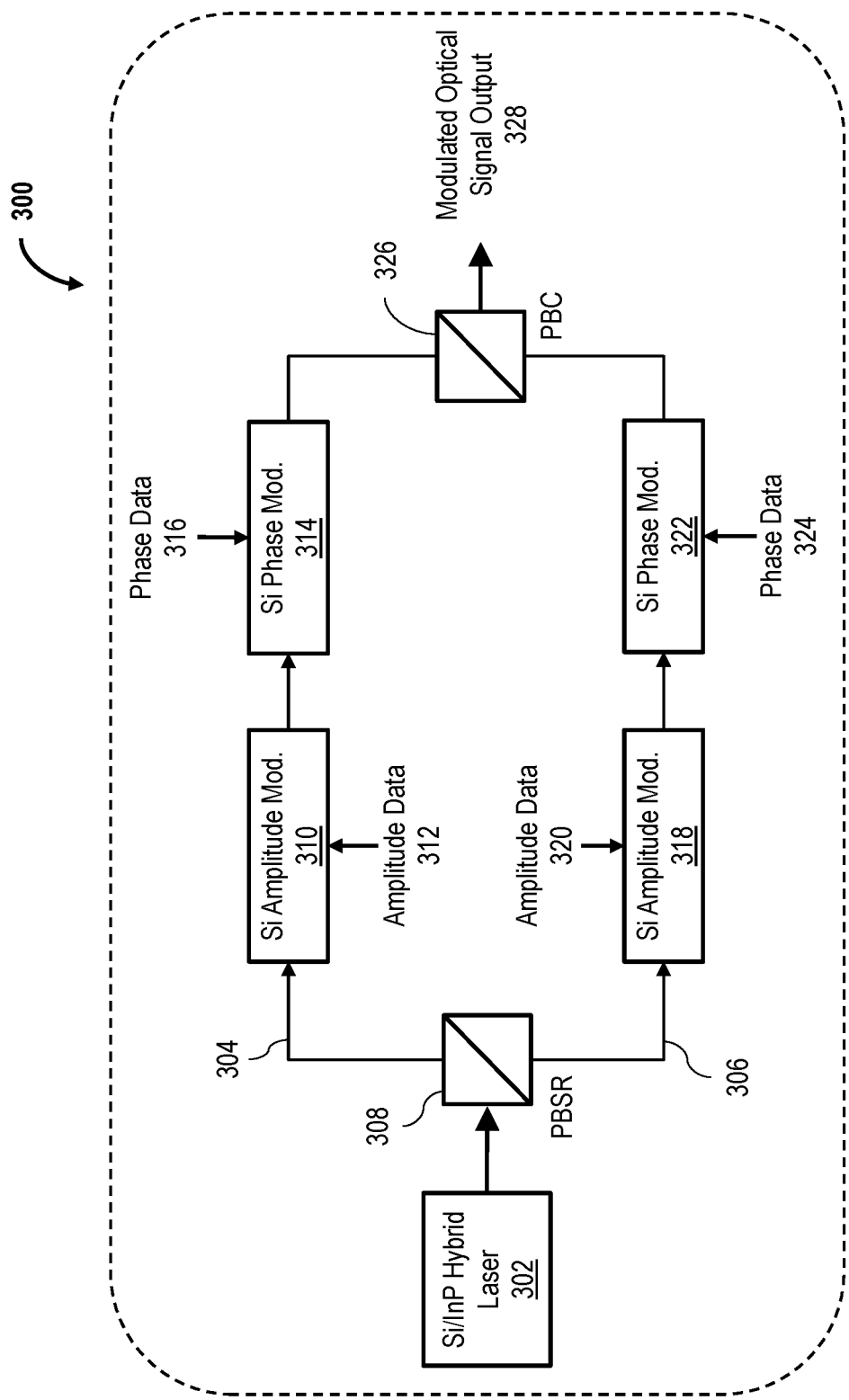
FIG. 3 is a schematic illustration depicting an exemplary dual-polarization optical full-field transmitter.

FIG. 3 is a schematic illustration depicting an exemplary dual-polarization OFFT 300. In an exemplary embodiment, OFFT 300 includes an integrated Si/InP hybrid laser 302, which thereby represents a heterogeneous integration of OFFT on an SoI platform. More particularly, OFFT 300 advantageously utilizes the photonics integration on the SoI platform to achieve heterogeneous integration on a single chip. It may be noted here that the phrase "heterogeneous integration" should not be confused with the heterogeneous multiplying of different signals of different types onto a single fiber strand for transmission. Although these different technologies are complementary, the term "heterogeneous" is applied differently to the two applications.

As depicted in FIG. 3, a heterogeneous OFFT photonics integration design on an SoI platform may be integrated on a single chip. This heterogeneous design thus further enables a significant simplification to the architecture of, for example, the COIL portion of transmitter 100, FIG. 1. That is, use of a high quality ECL integrated on the silicon enables achievement of the modified-OFFT-design-on-SoI. More specifically, by utilizing an integrated, or hybrid, ECL as the high-quality narrow-linewidth light source of hybrid laser 302, the two slave lasers and two optical circulators shown in transmitter 100, FIG. 1, may be rendered unnecessary in the simplified architecture of OFFT 300. Additionally, the fabrication process for OFFT is simplified in comparison with that of transmitter 100, since transmitter 100 requires inclusion of the slave lasers and optical circulators, as well as a number of polarization rotation waveguides, which collectively increase the complexity of the overall component. In contrast, the simplified design of OFFT 300 renders these additional components unnecessary.

In an exemplary embodiment, hybrid laser 302 may be a Si/InP hybrid ECL having (i) a passive SoI waveguide portion, and (ii) an active III-V portion, such as InP (not separately shown). Such a hybrid ECL may, for example, be fabricated by bonding the III-V active chip onto the SOI substrate, and then patterning the active region. Modal transfer between the III-V active layer and silicon passive layer may then be achieved using taper structures. Ring resonators in the silicon passive portion may be provided to enable single mode selection and wavelength tuning based on a thermal-optical effect, e.g., using upper metal heaters.

In exemplary operation of OFFT 300, the output of laser 302 is split into first path 304 and second path 306 by a polarization beam splitter rotator (PBSR) 308. In an embodiment, PBSR 308 may be a tapered silicon waveguide-based structure. In further operation of OFFT 300, the signal of first path 304 is amplitude-modulated by a first silicon amplifier modulator 310, which may, for example, include a silicon MZM construction in communication with a first amplitude data source 312, and then phase-modulated by a first phase modulator 314 in communication with a first phase data source 316. In a similar manner, the signal of second path 306 is amplitude-modulated by a second silicon amplifier modulator 318 (e.g., also a silicon MZM construction, in this example) in communication with a second amplitude data source 320, and then phase-modulated by a second phase modulator 322 in communication with a second phase data source 324.

In the exemplary embodiment, both the silicon-based MZM amplitude modulators 310, 318, and phase modulators 314, 322, may be carrier-depletion type modulators based on a free carrier plasma dispersion effect, to enable high modulation efficiencies, low driving voltages, high extinction ratios, and wide bandwidths. After the dual-modulation operations, the two-stage modulated signals from first and second paths 304, 306 are combined by a PBC 326 to realize polarization division multiplexing for a combined modulated optical signal output 328. Combined modulated optical signal output 328 may then be coupled off-chip by way of a mode size converter (not shown).

Accordingly, in comparison with a COIL-based OFFT design (e.g., transmitter 100, FIG. 1), the fabrication process of OFFT 300 is a significantly simplified such that heterogeneous integration is only required for the ECL portion thereof. The COIL-based design illustrated in FIG. 1, on the other hand, would require heterogeneous or hybrid integration for both of the two slave lasers and the two optical circulators, which could render such devices more complex and more expensive. The fabrication of OFFT 300 may be even further simplified through monolithic integration of PBSR 308 with silicon MZMs 310, 318 and phase modulators 314, 322. Thus, the majority of OFFT 300 may be fabricated using standard CMOS fabrication processes, since only hybrid ECL 302 would require heterogeneous bonding of the InP gain media onto the SoI waveguides.

The exemplary embodiment of OFFT 300 depicted in FIG. 3 is described above utilizing silicon MZMs for intensity modulation, this example is provided by way of illustration, and not in a limiting sense. Although state-of-art silicon MZMs, due to their wide modulation bandwidth and high extinction ratio, may be generally effective for an OFFT according to the embodiment depicted in FIG. 3, MZMs are also known to occupy a large footprint area on a chip (usually several millimeters in length), and also to introduce high optical loss. Nevertheless, both amplitude modulation and phase modulation are necessary for the OFFT to generate the intensity and phase modulated signal. Accordingly, a simplified OFFT architecture, which eliminates the need for an MZM, is described further below with respect to FIG. 4.

Figure 4:
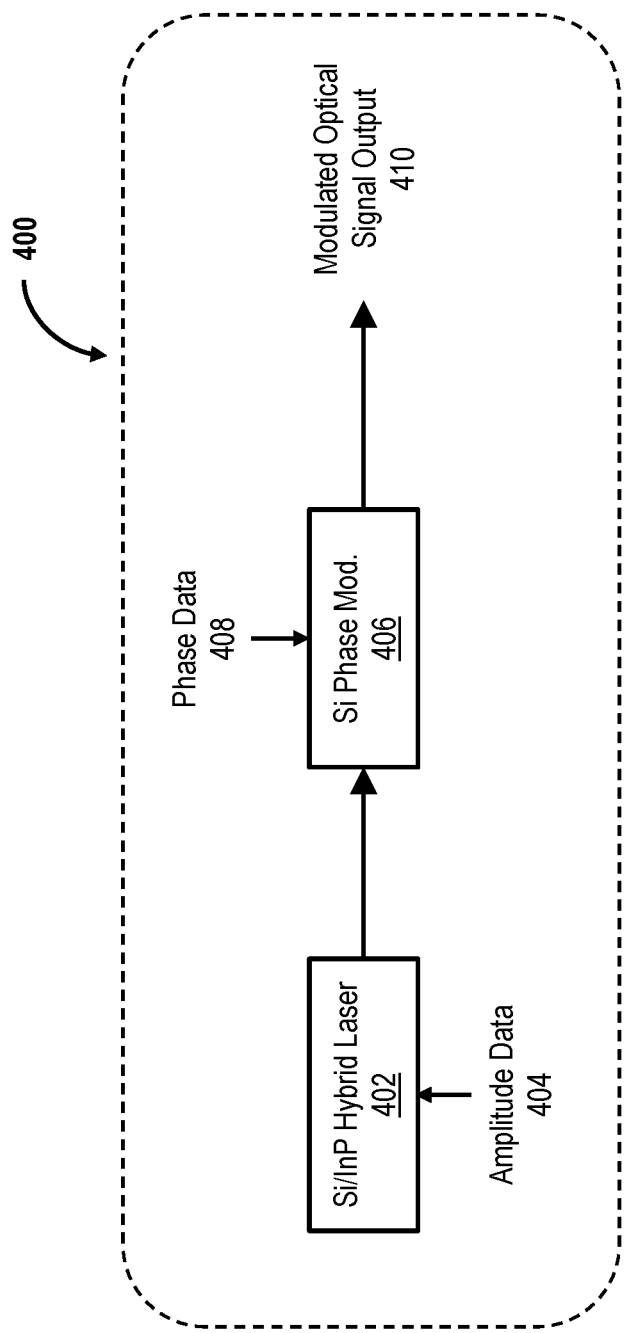
FIG. 4 is a schematic illustration depicting an exemplary single-polarization optical full-field transmitter.

FIG. 4 is a schematic illustration depicting an exemplary single-polarization OFFT 400. OFFT 400 is similar to OFFT 300, and includes a laser 402 that may also be an Si/InP heterogeneously integrated ECL, in the exemplary embodiment. OFFT 400 differs though, from OFFT 300, in that OFFT 400 directly modulates ECL 402 to generate the amplitude modulation signal. That is, according to the advantageous configuration of OFFT 400, instead of providing a separate amplitude modulator, laser 402 is directly in communication with an amplitude data source 404, and a 10 Gb/s non-return-to-zero (NRZ) signal may be generated by directly modulating the current of integrated ECL 402. The operation of OFFT 400 is then otherwise similar to that of OFFT 300, in that the intensity-modulated signal from laser 402 is then phase-modulated by a phase modulator 406 that is in communication with a phase data source 408 (e.g., to add phase information through phase modulator 406), to produce a modulated optical signal output 410 having both amplitude and phase modulation.

This direct modulation technique for integrated ECL 402 thus further simplifies the fabrication process of the OFFT, for example, in comparison with that of OFFT 300, FIG. 3, which integrates an external MZM with the laser. OFFT 400, therefore, represents a comparatively more cost-efficient approach. For ease of explanation, OFFT 400 is depicted in FIG. 4 as using a directly-modulated ECL for a single polarization.

Thus, according to the advantageous techniques described herein for OFFT 400, the on-chip optical loss and large device footprint of an OFFT according FIG. 3 may be significantly reduced by removing the need for silicon MZMs. However, some trade-off between the embodiments depicted in FIGS. 3 and 4 occurs for implementing a single-polarization case versus a dual-polarization case. Additionally, the modulation bandwidth of the directly-modulated laser of OFFT 400 is considered to be more limited in comparison to that of the MZM of OFFT 300. Accordingly, it may be more desirable to implement devices according to OFFT 400 for lower-cost applications, such as in the ONUs of a coherent PON, and devices according to OFFT 300 in the OLTs of the coherent PON, and/or P2P coherent access networks, which are less sensitive to cost, for the reasons discussed above.

InP Photonics-Based OFFT

In addition to the hybrid embodiments described above, the following embodiments demonstrate how InP, apart from the hybrid implementations with silicon, offers another material platform for state-of-the-art performance in optoelectronic devices, and more particularly such devices and systems operating in the 1300-1600 nm wavelength window. InP is a direct bandgap III-V compound semiconductor material; the embodiments described further herein advantageously leverage InP photonics integrated circuitry to enable monolithic integration of laser sources with other system or device components, such as modulators, amplifiers, multiplexers, and detectors, in wafer-scale processes and fabrication. An OFFT fabricated on an InP platform is described further below with respect to FIG. 5.

Figure 5:
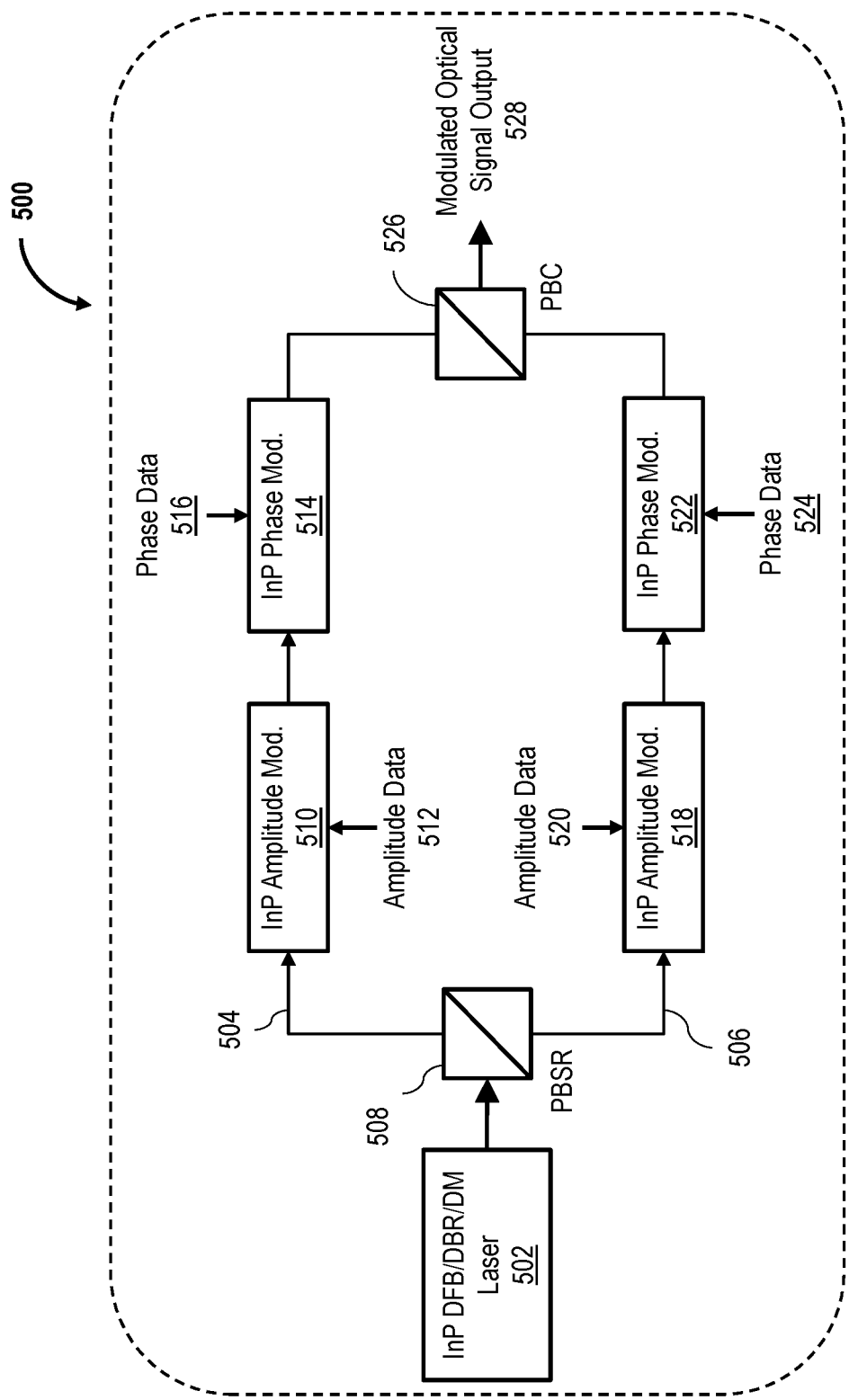
FIG. 5 is a schematic illustration depicting an alternative dual-polarization optical full-field transmitter.

FIG. 5 is a schematic illustration depicting an alternative dual-polarization OFFT 500. In an exemplary embodiment, OFFT 500 is similar to OFFT 300, FIG. 3, in its general architectural configuration and operation. OFFT 500 differs from OFFT 300 though, in that OFFT 500 advantageously leverages the monolithic integration capability of InP such that all of the respective components of OFFT 500 may be fabricated directly on an InP substrate without requiring hybrid/heterogeneous integration.

More particularly, in the exemplary embodiment, OFFT 500 includes a laser 502 as the light source thereof. Laser 502 may, for example, advantageously utilize one or more of a distributed feedback (DFB) laser, a distributed Bragg reflector (DBR) laser, and a discrete mode (DM) laser as the light source. These types of lasers may be particularly desirable for low-cost implementations, since each of these laser types is able to achieve single mode operation with relatively narrow linewidth, and while maintaining wavelength tuning capability up to a few nanometers.

In exemplary operation of OFFT 500, the output from laser 502 is split into first path 504 and second path 506 by a PBSR 508. The signal of first path 504 is amplitude-modulated by a first InP amplifier modulator 510, which may, for example, include an MZM or an electro-absorption modulator (EAM) in communication with a first amplitude data source 512. The amplitude-modulated signal along first path 504 is then phase-modulated by a first InP phase modulator 514 in communication with a first phase data source 516. In a similar manner, the signal of second path 506 is amplitude-modulated by a second InP amplifier modulator 518 in communication with a second amplitude data source 520, and then phase-modulated by a second InP phase modulator 522 in communication with a second phase data source 524. The amplitude- and phase-modulated signals from first and second paths 504, 506 are combined by a PBC 526 to realize polarization division multiplexing for a combined modulated optical signal output 528, which may be coupled off-chip by way of a mode size converter, similar to the silicon-based embodiment of OFFT 300, FIG. 3.

Also similar to OFFT 300, FIG. 3, because DFB/DBR/DM lasers are capable of high-speed direct modulation, the innovative principles of OFFT 500 may also be adapted to a single-polarization counterpart, similar to SiPho-based OFFT 400, FIG. 4, to effectively replace the MZM/EAM intensity modulators (e.g., first and second InP amplitude modulators 510, 518) by directly modulating the laser (e.g., laser 502). An exemplary InP single-polarization OFFT configuration is described further below with respect to FIG. 6.

Figure 6:
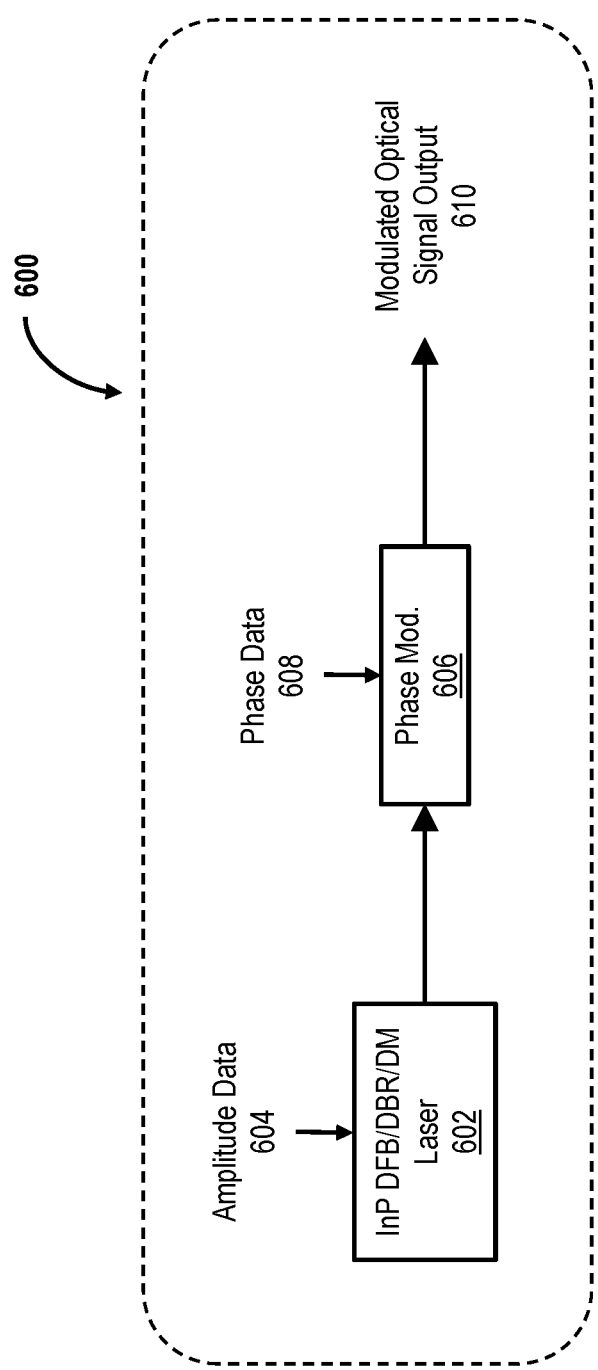
FIG. 6 is a schematic illustration depicting an alternative single-polarization optical full-field transmitter.

FIG. 6 is a schematic illustration depicting an alternative single-polarization OFFT 600. In an exemplary embodiment, OFFT 600 is similar to OFFT 400, FIG. 4, in general architecture and operation, but differs in that OFFT 600 advantageously leverages the monolithic integration InP capability of OFFT 500, FIG. 5, but for a single-polarization configuration that eliminates the need for separate intensity/amplitude modulators.

In an exemplary embodiment, OFFT 600 includes a laser 602, which may be a DFB, DBR, or DM laser, similar to laser 502, FIG. 5. Laser 602 differs though, from laser 502, in that laser 602 is directly modulated by OFFT 600. That is, laser 602 is directly in communication with an amplitude data source 604, and generates an intensity-modulated signal from laser 602 that is then phase-modulated by a phase modulator 606, which itself is in communication with a phase data source 608. A modulated optical signal output 610, having both amplitude and phase modulation, is generated after operation of phase modulator 606.

According to the advantageous configuration of OFFT 600, the direct modulation of laser 602 enables not only a much simpler fabrication process, but also eliminates the extra insertion loss that would have been introduced by an external MZM/EAM (e.g., used in OFFT 500, FIG. 5). Nevertheless, the implementation of direct amplitude modulation (i.e., at laser 602), followed by phase modulation (i.e., through phase modulator 606) forms the OFFT (i.e., OFFT 600), as explained above with respect to FIGS. 2A-B.

Similar to the SiPho embodiment described above with respect to FIG. 4, an OFFT according to the configuration depicted in FIG. 6 requires only one laser source, plus one phase modulator, for OFFT operation. Also similar to the SiPho embodiment though, the InP embodiment of OFFT 600 may be subject to trade-offs with respect to single-polarization applications, and/or according to modulation bandwidth limitations of laser 602. Nevertheless, implementation of the principles of OFFT 600 enables significant reductions to both the on-chip optical loss, as well as the device footprint. The ability to reduce the size of the chip is a significant advantage achieved by the present InP platform embodiments over conventional devices, given that an InP wafer size is typically limited to approximately four inches.

According to the innovative embodiments described herein, unique systems, apparatuses, and methods are provided for several OFFT designs on SiPho and InP platforms to reduce either or both of the cost and footprint of an optoelectronic device based on these technology platforms. These innovative embodiments herein are particularly advantageous for use in coherent optical access network applications, including but not limited to PONs and P2P communication networks. In exemplary embodiments, the technological innovations described herein yield significant improvements to both dual-polarization and single-polarization implementations.

Exemplary embodiments of optical communication systems, devices, and methods are described above in detail. The systems and methods of this disclosure though, are not limited to only the specific embodiments described herein, but rather, the components and/or steps of their implementation may be utilized independently and separately from other components and/or steps described herein. Additionally, the exemplary embodiments can be implemented and utilized in connection with other access networks utilizing fiber and coaxial transmission at the end user stage.

The embodiments described herein may be further implemented, for example with respect optical communication networks utilizing a DOCSIS protocol, and also with respect to one or more systems utilizing protocols such as EPON, RFoG, GPON, or Satellite Internet Protocol, without departing from the scope of the embodiments herein. The present embodiments are therefore particularly useful for communication systems configured for use in existing 4G and 5G networks, and also for new radio (NR) and future generation networks that utilize such communication protocols, in whole or in part.

Although specific features of various embodiments of the disclosure may be shown in some drawings and not in others, such illustrative techniques are for convenience only. In accordance with the principles of the disclosure, a particular feature shown in a drawing may be referenced and/or claimed in combination with features of the other drawings.

Some embodiments involve the use of one or more electronic or computing devices. Such devices typically include a processor or controller, such as a general purpose central processing unit (CPU), a graphics processing unit (GPU), a microcontroller, a reduced instruction set computer (RISC) processor, an application specific integrated circuit (ASIC), a programmable logic circuit (PLC), a field programmable gate array (FPGA), a DSP device, and/or any other circuit or processor capable of executing the functions described herein. The processes described herein may be encoded as executable instructions embodied in a computer readable medium, including, without limitation, a storage device and/or a memory device. Such instructions, when executed by a processor, cause the processor to perform at least a portion of the methods described herein. The above examples are exemplary only, and thus are not intended to limit in any way the definition and/or meaning of the term "processor."

This written description uses examples to disclose the embodiments, including the best mode, and also enables a person skilled in the art to practice the embodiments, including the make and use of any devices or systems and the performance of any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. An optical full-field transmitter for an optical communications network, the transmitter comprising:
    a primary laser source configured to provide a narrow spectral linewidth for a primary laser signal;
    a first intensity modulator in communication with a first amplitude data source, the first intensity modulator configured to implement amplitude modulation to output a first amplitude-modulated optical signal from the primary laser signal; and
    a first phase modulator in communication with a first phase data source and the first amplitude-modulated optical signal, the first phase modulator configured to implement phase modulation on the first amplitude-modulated optical signal to output a first two-stage full-field optical signal,
    wherein the primary laser source has a structure based on a III-V compound,
    wherein the amplitude modulation by the first intensity modulator is orthogonal to the phase modulation by the first phase modulator, and
    wherein the primary laser source, the first intensity modulator, and the first phase modulator are integrated together.

2. The transmitter of claim 1, wherein the III-V compound comprises indium phosphide (InP).

3. The transmitter of claim 2, wherein the primary laser source comprises an integrated silicon (Si)/InP hybrid laser.

4. The transmitter of claim 3, wherein the integrated Si/InP hybrid laser comprises a heterogeneous integration on a silicon-on-insulator (SoI) waveguide circuit wafer.

5. The transmitter of claim 4, wherein the integrated Si/InP hybrid laser further comprises a passive SoI waveguide portion and an active InP portion.

6. The transmitter of claim 3, wherein the first phase modulator comprises a silicon-based construction.

7. The transmitter of claim 6, wherein the integrated Si/InP hybrid laser includes the first intensity modulator.

8. The transmitter of claim 7, wherein the first two-stage full-field optical signal is a single-polarization signal.

9. The transmitter of claim 6, wherein the first intensity modulator is disposed in a first optical path between the integrated Si/InP hybrid laser and the first phase modulator.

10. The transmitter of claim 9, wherein the first intensity modulator comprises a silicon-based Mach-Zehnder modulator construction.

11. The transmitter of claim 9, further comprising:
a polarization beam splitter rotator (PBSR) configured to receive the primary laser signal from the primary laser source and route the primary laser signal to the first optical path and to a second optical path different from the first optical path;
a second intensity modulator disposed along the second optical path opposite the integrated Si/InP hybrid laser with respect to the PBSR, the second intensity modulator in communication with a second amplitude data source and configured to output a second amplitude-modulated optical signal from the primary laser signal;
a second phase modulator in communication with a second phase data source and the second amplitude-modulated optical signal, the second phase modulator configured to output a second two-stage full-field optical signal; and
a polarization beam combiner configured to receive the first and second two-stage full-field optical signals and output a dual-polarization optical signal.

12. The transmitter of claim 2, wherein the primary laser source comprises an InP photonics-based laser formed on an InP substrate.

13. The transmitter of claim 12, wherein the first phase modulator comprises an InP-based construction.

14. The transmitter of claim 13, wherein the InP photonics-based laser includes the first intensity modulator.

15. The transmitter of claim 14, wherein the first two-stage full-field optical signal is a single-polarization signal.

16. The transmitter of claim 13, wherein the first intensity modulator is disposed in a first optical path between the InP photonics-based laser and the first phase modulator.

17. The transmitter of claim 16, wherein the first intensity modulator comprises an InP-based construction comprising at least one of a Mach-Zehnder modulator and an electro-absorption modulator.

18. The transmitter of claim 16, wherein the InP photonics-based laser, the first intensity modulator, and the first phase modulator are monolithically integrated together.

19. The transmitter of claim 16, further comprising:
a polarization beam splitter rotator (PBSR) configured to receive the primary laser signal from the primary laser source and route the primary laser signal to the first optical path and to a second optical path different from the first optical path;
a second intensity modulator disposed along the second optical path opposite the InP photonics-based laser with respect to the PBSR, the second intensity modulator in communication with a second amplitude data source and configured to output a second amplitude-modulated optical signal from the primary laser signal;
a second phase modulator in communication with a second phase data source and the second amplitude-modulated optical signal, the second phase modulator configured to output a second two-stage full-field optical signal; and
a polarization beam combiner configured to receive the first and second two-stage full-field optical signals and output a dual-polarization optical signal.

20. The transmitter of claim 19, wherein the InP photonics-based laser, the PBSR, the first and second intensity modulators, the first and second phase modulators, and the polarization beam combiner are monolithically integrated together.

* * * * *